(12) United States Patent
Manda et al.

(10) Patent No.: US 9,893,105 B2
(45) Date of Patent: *Feb. 13, 2018

(54) IMAGE PICKUP ELEMENT, METHOD OF MANUFACTURING IMAGE PICKUP ELEMENT, AND ELECTRONIC APPARATUS

(71) Applicant: Sony Corporation, Tokyo (JP)

(72) Inventors: Shuji Manda, Kumamoto (JP); Susumu Hiyama, Kumamoto (JP); Yasuyuki Shiga, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/299,220

(22) Filed: Oct. 20, 2016

(65) Prior Publication Data

US 2017/0040359 A1 Feb. 9, 2017

Related U.S. Application Data

(63) Continuation of application No. 15/079,834, filed on Mar. 24, 2016, now Pat. No. 9,502,454, which is a
(Continued)

(30) Foreign Application Priority Data

Sep. 27, 2013 (JP) ................................ 2013-202123

(51) Int. Cl.
*H01L 27/146* (2006.01)
*H04N 5/378* (2011.01)

(52) U.S. Cl.
CPC ...... *H01L 27/1463* (2013.01); *H01L 27/1464* (2013.01); *H01L 27/14621* (2013.01);
(Continued)

(58) Field of Classification Search
CPC ........... H01L 27/14689; H01L 27/1463; H01L 27/14621; H01L 27/14645; H01L 27/1464; H01L 27/14623
See application file for complete search history.

(56) References Cited

U.S. PATENT DOCUMENTS

2006/0049476 A1* 3/2006 Koizumi ........... H01L 27/14627
257/432
2010/0117126 A1* 5/2010 Takahashi ......... H01L 27/14609
257/292
(Continued)

FOREIGN PATENT DOCUMENTS

| JP | 2006-282480 | 10/2006 |
| JP | 2012-191005 | 10/2012 |
| JP | 2013-175494 | 9/2013 |

OTHER PUBLICATIONS

Official Action (no English translation available) for Japanese Patent Application No. 2013-202123 dated May 16, 2017, 4 pages.
(Continued)

*Primary Examiner* — Nathan W Ha
(74) *Attorney, Agent, or Firm* — Sheridan Ross P.C.

(57) ABSTRACT

An image pickup element includes: a semiconductor substrate including a photoelectric conversion section for each pixel; a pixel separation groove provided in the semiconductor substrate; and a fixed charge film provided on a light-receiving surface side of the semiconductor substrate, wherein the fixed charge film includes a first insulating film and a second insulating film, the first insulating film being provided contiguously from the light-receiving surface to a wall surface and a bottom surface of the pixel separation groove, and the second insulating film being provided on a part of the first insulating film, the part corresponding to at least the light-receiving surface.

28 Claims, 6 Drawing Sheets

Related U.S. Application Data continuation of application No. 14/491,375, filed on Sep. 19, 2014, now Pat. No. 9,337,226.

(52) U.S. Cl.
CPC .. *H01L 27/14623* (2013.01); *H01L 27/14627* (2013.01); *H01L 27/14636* (2013.01); *H01L 27/14641* (2013.01); *H01L 27/14645* (2013.01); *H01L 27/14685* (2013.01); *H01L 27/14689* (2013.01); *H04N 5/378* (2013.01)

(56) References Cited

U.S. PATENT DOCUMENTS

| | | | | |
|---|---|---|---|---|
| 2010/0133420 | A1* | 6/2010 | Ogino | G01J 1/02 250/227.2 |
| 2012/0086845 | A1* | 4/2012 | Enomoto | H01L 27/14614 348/311 |
| 2012/0202310 | A1* | 8/2012 | Sawayama | H01L 27/14629 438/69 |
| 2012/0217602 | A1* | 8/2012 | Enomoto | H01L 27/14614 257/432 |
| 2014/0048897 | A1* | 2/2014 | Qian | H01L 27/1463 257/431 |
| 2017/0125461 | A1* | 5/2017 | Enomoto | H01L 27/1463 |

OTHER PUBLICATIONS

Official Action (with English translation) for Korean Patent Application No. 10-2014-0121980 dated Mar. 21, 2017, 13 pages.
Official Action (no English translation available) for Japanese Patent Application No. 2013-202123 dated Dec. 27, 2016, 5 pages.
Official Action (with English translation) for Korean Patent Application No. 10-2014-0121980 dated Sep. 5, 2017, 6 pages.
Official Action (with English translation) for Korean Patent Application No. 10-2014-0121980 dated Nov. 24, 2017, 7 pages.

* cited by examiner

IMAGE PICKUP ELEMENT, METHOD OF MANUFACTURING IMAGE PICKUP ELEMENT, AND ELECTRONIC APPARATUS

CROSS REFERENCE TO RELATED APPLICATIONS

This application is a continuation of U.S. patent application Ser. No. 15/079,834, filed Mar. 24, 2016, which is a continuation of U.S. patent application Ser. No. 14/491,375, filed Sep. 19, 2014, now U.S. Pat. No. 9,337,226, which claims the benefit of Japanese Patent Application No. JP 2013-202123 filed Sep. 27, 2013, the entire disclosures of which are hereby incorporated herein by reference.

BACKGROUND

The present disclosure relates to an image pickup element having a fixed charge film on a semiconductor substrate, a method of manufacturing such an image pickup element, and an electronic apparatus including such an image pickup element.

In a solid-state image pickup device (an image pickup device) such as a charge coupled device (CCD) image sensor and a complementary metal oxide semiconductor (CMOS) image sensor, a solid-state image pickup element (an image pickup element) including a photoelectric conversion section is disposed for each pixel. The photoelectric conversion section of the image pickup element may be configured of, for example, a semiconductor material such as silicon (Si). On a surface of the photoelectric conversion section, crystal defects and dangling bonds are present due to breaking of a crystal structure. The crystal defects and the dangling bonds lead to extinction, due to recombination of an electron-hole pair generated in the photoelectric conversion section, or lead to generation of a dark current.

For example, International Publication No. WO 2012/117931 discusses a solid-state image pickup device of a backside illumination type. In this solid-state image pickup device, in order to suppress generation of a dark current, an insulating film (a fixed charge film) having negative fixed charge on a light-receiving surface (a back surface) of a Si substrate is formed. In the Si substrate, a photodiode is embedded as a photoelectric conversion section. On a Si surface where the fixed charge film is formed, an inversion layer is formed. A Si interface is pinned by this inversion layer, which suppresses the generation of the dark current.

Further, in the Si substrate, a groove may be provided between pixels next to each other, and optical color mixture may be suppressed by filling this groove with an insulating film.

SUMMARY

In general, the above-described groove is formed by dry etching. However, the dry etching may cause crystal defects and dangling bonds on a surface of the Si substrate (in particular, a wall surface and a bottom surface of the groove), which may lead to an increase in interface state. Therefore, a dark current may be easily generated.

It is desirable to provide an image pickup element capable of suppressing generation of a dark current, a method of manufacturing such an image pickup element, and an electronic apparatus including such an image pickup element.

According to an embodiment of the present technology, there is provided an image pickup element including: a semiconductor substrate including a photoelectric conversion section for each pixel; a pixel separation groove provided in the semiconductor substrate; and a fixed charge film provided on a light-receiving surface side of the semiconductor substrate, wherein the fixed charge film includes a first insulating film and a second insulating film, the first insulating film being provided contiguously from the light-receiving surface to a wall surface and a bottom surface of the pixel separation groove, and the second insulating film being provided on a part of the first insulating film, the part corresponding to at least the light-receiving surface.

According to an embodiment of the present technology, there is provided a method of manufacturing an image pickup element, the method including forming a fixed charge film on a light-receiving surface of a semiconductor substrate that includes a photoelectric conversion section for each pixel and has a pixel separation groove, wherein the forming of the fixed charge film includes forming a first insulating film to be provided contiguously from the light-receiving surface to a wall surface and a bottom surface of the pixel separation groove, and forming a second insulating film to be provided on a part of the first insulating film, the part corresponding to at least the light-receiving surface.

According to an embodiment of the present technology, there is provided an electronic apparatus provided with an image pickup element, the image pickup element including: a semiconductor substrate including a photoelectric conversion section for each pixel; a pixel separation groove provided in the semiconductor substrate; and a fixed charge film provided on a light-receiving surface side of the semiconductor substrate, wherein the fixed charge film includes a first insulating film and a second insulating film, the first insulating film being provided contiguously from the light-receiving surface to a wall surface and a bottom surface of the pixel separation groove, and the second insulating film being provided on a part of the first insulating film, the part corresponding to at least the light-receiving surface.

In the image pickup element, the method of manufacturing the image pickup element, and the electronic apparatus according to the above-described embodiments of the present technology, the fixed charge film formed on the light-receiving surface side of the semiconductor substrate is a laminated film including the first insulating film and the second insulating film. The first insulating film is provided contiguously from the light-receiving surface to the wall surface and the bottom surface of the pixel separation groove. The second insulating film is provided on the light-receiving surface. By thus configuring the fixed charge film using two kinds of insulating films formed in different regions, an interface state of a surface of the semiconductor substrate (specifically, the wall surface and the bottom surface of the pixel separation groove) improves.

In the image pickup element, the method of manufacturing the image pickup element, and the electronic apparatus according to the above-described embodiments of the present technology, the fixed charge film is formed on the light-receiving surface side of the semiconductor substrate, as a laminated film including two kinds of insulating films (the first insulating film and the second insulating film) formed in different regions. This improves the interface state of the wall surface and the bottom surface of the pixel separation groove formed in the semiconductor substrate, thereby allowing generation of a dark current to be suppressed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

An embodiment of the present disclosure will be described below in detail with reference to the drawings. It is to be noted that the description will be provided in the following order.

1. Embodiment (an example in which a fixed charge film has a multilayer structure, and layers are formed using different manufacturing methods)
2. Modification (an example in which a light-shielding film is provided also in a pixel separation groove)
3. Application examples (application examples to a solid-state image pickup device and an electronic apparatus)

1. Embodiment

Figure 1:
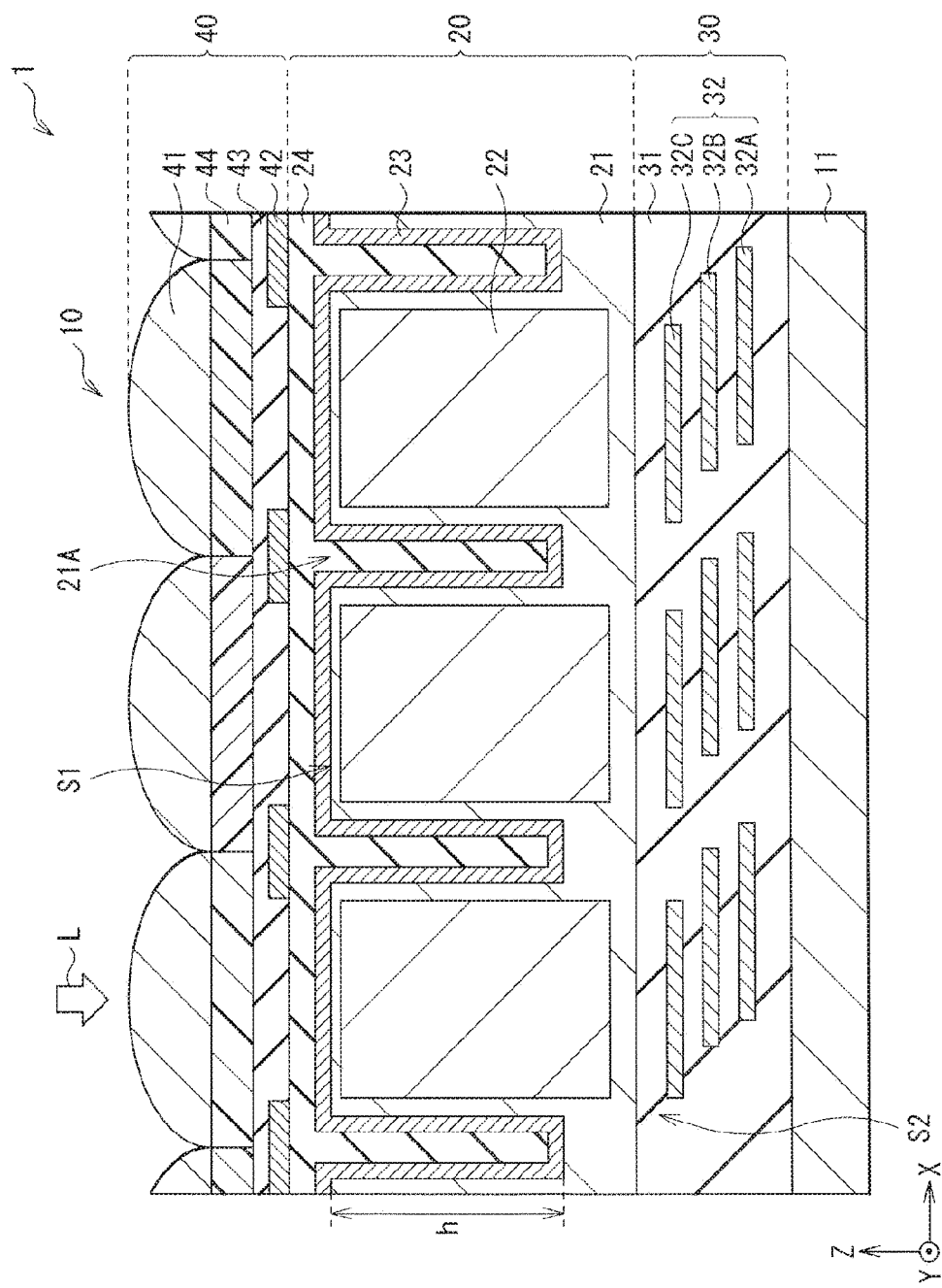
FIG. 1 is a cross-sectional diagram of an image pickup element according to an embodiment of the present technology.

FIG. 1 illustrates a cross-sectional configuration of an image pickup element (an image pickup element 10) according to an embodiment of the present technology. The image pickup element 10 may configure, for example, one pixel (for example, a pixel P), in an image pickup device (an image pickup device 1) such as a CCD image sensor and a CMOS image sensor (see FIG. 5). The image pickup element 10 may be of a backside illumination type, and includes a light receiving section 20, a wiring layer 30, and a condensing section 40. The light receiving section 20 includes a photoelectric conversion section 22. The condensing section 40 is provided on a light incident surface (a light-receiving surface S1) side of the light receiving section 20. The wiring layer 30 is provided on a surface on a side opposite to the light incident surface side. The light receiving section 20 includes a semiconductor substrate 21, a fixed charge film 23, and a protective film 24. The semiconductor substrate 21 has a groove (a pixel separation groove 21A), which is provided on the light incident surface side and between the pixels P. The fixed charge film 23 and the protective film 24 are provided on an entire surface, which is on the light incident surface side, of the semiconductor substrate 21. The image pickup element 10 of the present embodiment partially has a laminated structure in which the fixed charge film 23 is formed of two kinds of insulating films (a first insulating film 23A and a second insulating film 23B) that are formed in different regions.

A configuration of the image pickup element 10 will be described below, in order of the light receiving section 20, the wiring layer 30, and the condensing section 40.

(Light Receiving Section)

The light receiving section 20 includes the semiconductor substrate 21 and the fixed charge film 23. In the semiconductor substrate 21, for example, a photodiode may be embedded as the photoelectric conversion section 22. The fixed charge film 23 is provided on a back surface (the light incident surface, or the light-receiving surface S1) of the semiconductor substrate 21.

The semiconductor substrate 21 may be configured of, for example, p-type silicon (Si), and has the pixel separation groove 21A as described above. The pixel separation groove 21A is provided between the pixels P on the light-receiving surface S1 side, to extend in a thickness direction (a Z direction) of the semiconductor substrate 21. A depth (a height (h)) of the pixel separation groove 21A may only be a depth allowing suppression of crosstalk, and may be, for example, 0.25 μm or more and 5 μm or less. A width (W) of the pixel separation groove 21A may only be a width allowing suppression of crosstalk, and may be, for example, 100 nm or more and 1,000 nm or less.

In proximity to the surface (a surface S2) of the semiconductor substrate 21, a transfer transistor is disposed. The transfer transistor may transfer, for example, signal charge generated in the photoelectric conversion section 22, to a vertical signal line Lsig (see FIG. 5). A gate electrode of the transfer transistor may be, for example, provided in the wiring layer 30. The signal charge may be either an electron or a positive hole generated by photoelectric conversion. Here, a case in which an electron is read out as the signal charge will be described as an example.

In proximity to the surface S2 of the semiconductor substrate 21, for example, components such as a reset transistor, an amplifying transistor, and a select transistor may be provided together with the above-described transfer transistor. Such transistors may each be, for example, a metal oxide semiconductor field effect transistor (MOSEFT), and included in a circuit for each of the pixels P. Each of the circuits may have, for example, a three-transistor configuration including a transfer transistor, a reset transistor, and an amplifying transistor, or may have a four-transistor configuration including a select transistor in addition to these three transistors. The transistors except the transfer transistor may also be shared by the pixels.

The photoelectric conversion section 22 (the photodiode) may be, for example, an n-type semiconductor region, which is formed in the thickness direction (the Z direction) of the semiconductor substrate 21 (here, a Si substrate), for each of the pixels P. The photoelectric conversion section 22 may be a pn-junction-type photodiode, with a p-type semiconductor region provided in proximity to a front surface and a back surface of the semiconductor substrate 21. It is to be noted that, in the semiconductor substrate 21, a p-type semiconductor region is also formed between the pixels P, and the above-described pixel separation groove 21A is formed in this p-type semiconductor region.

Figure 2A:
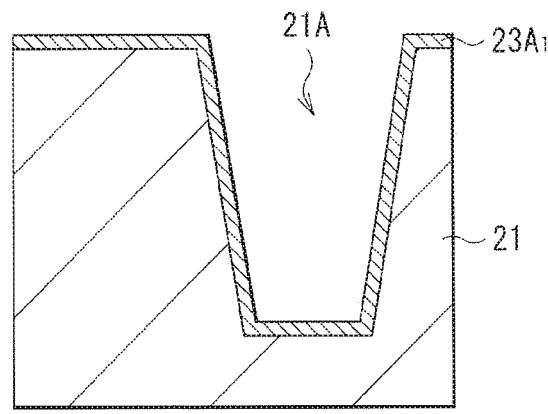
FIG. 2A is a cross-sectional diagram used to describe a method of manufacturing a fixed charge film of the image pickup element illustrated in FIG. 1.
Figure 2B:
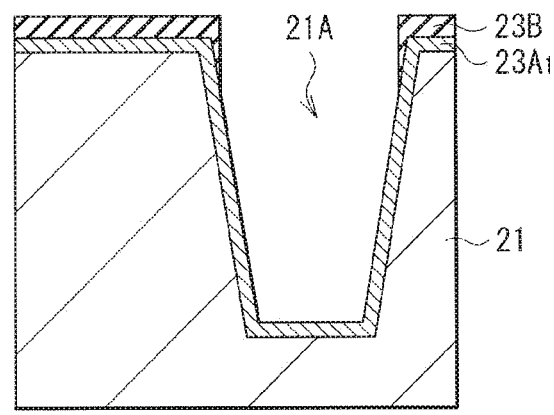
FIG. 2B is a cross-sectional diagram illustrating a process following a process in FIG. 2A.
Figure 2C:
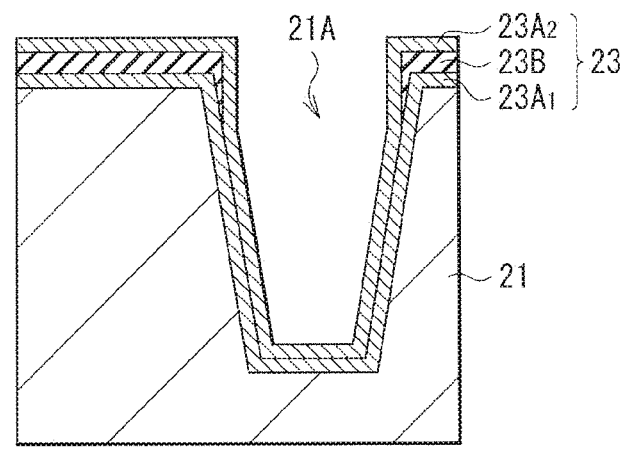
FIG. 2C is a cross-sectional diagram illustrating an example of a configuration of the fixed charge film, together with a process following the process in FIG. 2B.

The fixed charge film 23 has negative charge, and has a configuration in which the first insulating film 23A and the second insulating film 23B are partially laminated (for example, see FIG. 2C). Specifically, the first insulating film 23A is provided on the entire back surface of the semiconductor substrate 21, namely, provided on the light-receiving surface S1 of the semiconductor substrate 21 as well as contiguously from a wall surface to a bottom surface of the pixel separation groove 21A. It is to be noted that the first insulating film 23A includes multiple layers (here, two layers ($23A_1$ and $23A_2$)). The second insulating film 23B is provided on a region (the light-receiving surface S1), which excludes an inner wall (the wall surface and the bottom surface) of the pixel separation groove 21A, of the semiconductor substrate 21. It is to be noted that the second insulating film 23B is formed contiguously from the light-receiving surface S1 to a part of the wall surface of the pixel separation groove 21A.

Figure 3A:
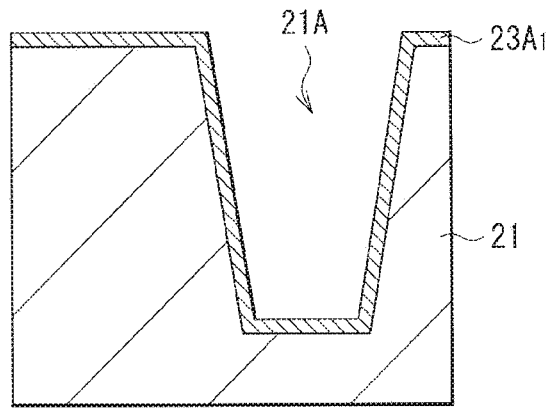
FIG. 3A is a cross-sectional diagram used to describe another method of manufacturing the fixed charge film of the image pickup element illustrated in FIG. 1.
Figure 3B:
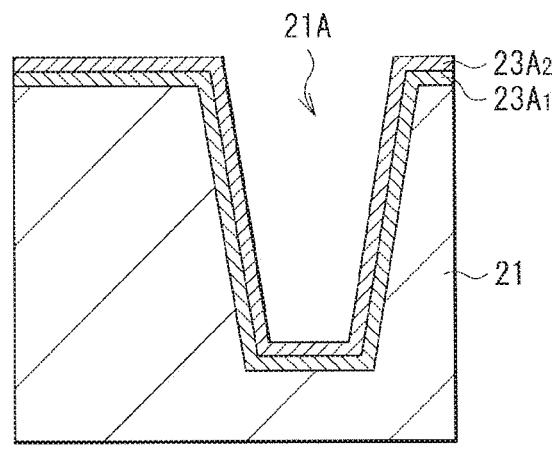
FIG. 3B is a cross-sectional diagram illustrating a process following a process in FIG. 3A.
Figure 3C:
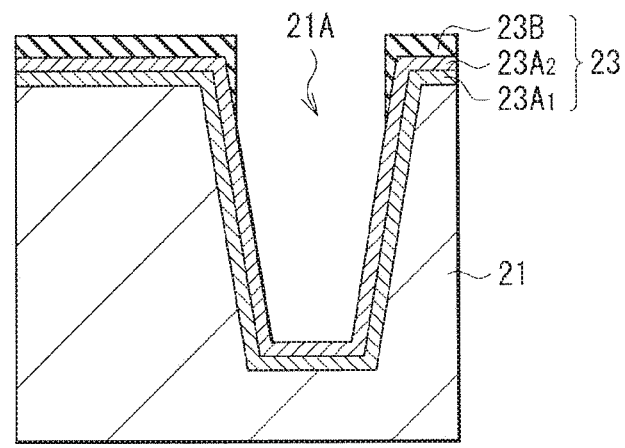
FIG. 3C is a cross-sectional diagram illustrating another configuration example of the fixed charge film, together with a process following the process in FIG. 3B.

The first insulating film 23A may be formed by, for example, atomic layer deposition (ALD) or metal organic chemical vapor deposition (MOCVD). The second insulating film 23B may be formed, for example, by physical vapor deposition (PVD). The first insulating film 23A and the second insulating film 23B may be formed in any lamination order, if the first insulating film 23A is at least directly formed on the semiconductor substrate 21. In the present embodiment, as illustrated in FIG. 2C, the fixed charge film 23 may have, for example, a configuration in which the first insulating film $23A_1$, the second insulating film 23B, and the first insulating film $23A_2$ are laminated in this order from the semiconductor substrate 21 side. Alternatively, as illustrated in FIG. 3C, the first insulating film $23A_1$, the first insulating film $23A_2$, and the second insulating film 23B may be laminated in this order from the semiconductor substrate 21 side.

The first insulating films $23A_1$ and $23A_2$ may each preferably have, for example, a thickness of 1 nm or more 25 nm or less. The first insulating film 23A ($23A_1$ and $23A_2$) may be preferably formed to have an overall thickness of 2 nm or more and 100 nm or less. This makes it possible to improve pinning performance of the semiconductor substrate 21 on the wall surface and the bottom surface of the pixel separation groove 21A. The second insulating film 23B may preferably have, for example, a film thickness of 10 nm or more and 80 nm or less.

As a material of the fixed charge film 23 (23A and 23B), a high dielectric material having fixed charge may be preferably used. Specific examples of the material may include hafnium oxide ($HfO_2$), zirconium oxide ($ZrO_2$), aluminum oxide ($Al_2O_3$), titanium oxide ($TiO_2$), and tantalum oxide ($Ta_2O_5$). These oxides have been used for films such as a gate insulating film of an insulated-gate field-effect-transistor and therefore, a film formation method has been established. Hence, films of these oxides may be easily formed. In particular, using materials such as $HfO_2$ (a refractive index of 2.05), $Ta_2O_5$ (a refractive index of 2.16), and $TiO_2$ (a refractive index of 2.20) whose refractive index is relatively low, adds an antireflection effect to the fixed charge film 23. Other examples of the material may include rare earth element oxide. Specific examples of the rare earth element oxide may include lantern (La), praseodymium (Pr), cerium (Ce), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and yttrium (Y). It is to be noted that silicon (Si) may be added to the above-described oxide to the extent of not impairing an insulation property. Alternatively, other than the oxide, nitride and oxynitride such as hafnium nitride, aluminum nitride, hafnium oxynitride, and aluminum oxynitride may be used. Adding Si or Ni to the fixed charge film 23 improves heat resistance and capability of blocking ion implantation to a Si interface and the Si substrate during the process.

The first insulating film 23A ($23A_1$ and $23A_2$) and the second insulating film 23B may be configured of the same material, but the materials of the first insulating film 23A and the second insulating film 23B may be different. A manufacturing process may be simplified using the same material for the first insulating films $23A_1$ and $23A_2$ that use a common manufacturing method. Alternatively, the first insulating films $23A_1$ and $23A_2$ as well as the second insulating film 23B may be formed using different materials. Preferable materials of each of the insulating films $23A_1$, $23A_2$, and 23B may be as follows. First, examples of the preferable material of the first insulating film $23A_1$ may include $HfO_2$, $ZrO_2$, and $Al_2O_3$. Examples of the preferable material of the first insulating film $23A_2$ may include $HfO_2$, $ZrO_2$, $Al_2O_3$, $TiO_2$, and $Ta_2O_5$. Examples of the preferable material of the second insulating film 23B may include $HfO_2$, $ZrO_2$, $Al_2O_3$, $TiO_2$, and $Ta_2O_5$. In particular, use of a material having a high refractive index for the second insulating film 23B, which is formed to be thicker than the first insulating film 23A, makes it possible to efficiently obtain an antireflection effect, and to improve sensitivity of the image pickup element 10, by increasing light entering the photoelectric conversion section 22.

The protective film 24 is provided on the fixed charge film 23, and a back surface of the light receiving section 20 is flattened by filling the pixel separation groove 21A with the protective film 24. The protective film 24 may be configured of, for example, a single layer film of silicon nitride ($Si_2N_3$), silicon oxide ($SiO_2$), silicon oxynitride (SiON), and the like, or a laminated film of these materials.

(Wiring Layer)

The wiring layer 30 is provided in contact with the surface (the surface S2) of the semiconductor substrate 21. The wiring layer 30 includes a plurality of wirings 32 (for example, 32A, 32B, and 32C) in an interlayer insulating film 31. The wiring layer 30 may be, for example, adhered to a supporting substrate 11 made of Si. The wiring layer 30 is disposed between the supporting substrate 11 and the semiconductor substrate 21.

(Condensing Section)

The condensing section 40 is provided on the light-receiving surface S1 side of the light receiving section 20, and has an on-chip lens 41 on a light incident side. The on-chip lens 41 is disposed, as an optical functional layer, to face the photoelectric conversion section 22 of each of the pixels P. Between the light receiving section 20 (specifically, the protective film 24) and the on-chip lens 41, a flattening film 43 and a color filter 44 are laminated in this order from the light receiving section 20 side. Further, a light-shielding film 42 is provided on the protective film 24 between the pixels P.

The on-chip lens 41 has a function of condensing light towards the light receiving section 20 (specifically, the photoelectric conversion section 22 of the light receiving section 20). A lens diameter of the on-chip lens 41 is set at a value corresponding to the size of the pixel P and may be, for example, 0.9 μm or more and 8 μm or less. Further, a refractive index of the on-chip lens 41 may be, for example, 1.5 or more and 1.9 or less. Examples of a lens material may include an organic material and a silicon oxide film ($SiO_2$).

The light-shielding film 42 may be provided between the pixels P, namely, for example, at a position, which corresponds to the pixel separation groove 21A, of the protective film 24. The light-shielding film 42 suppresses color mixture due to crosstalk of obliquely entering light between the adjacent pixels. Examples of a material of the light-shielding film 42 may include tungsten (W), aluminum (Al), and an alloy of Al and copper (Cu). The light-shielding film 42 may have, for example, a film thickness of 20 nm or more and 5,000 nm or less.

The flattening film 43 may be configured of, for example, a single layer film of any of silicon nitride ($Si_2N_3$), silicon oxide ($SiO_2$), silicon oxynitride (SiON), and the like, or a laminated film of any of these materials.

The color filter 44 may be, for example, any of a red (R) filter, a green (G) filter, a blue (B) filter, and a white filter (W), and may be, for example, provided for each of the pixels P. These color filters 44 are provided in a regular color array (for example, a Bayer array). In the image pickup element 10, light receiving data of colors corresponding to the color array is obtained by providing these color filters 44.

The image pickup element 10 as described above may be manufactured as follows, for example.

(Manufacturing Method)

First, the semiconductor substrate 21 including various transistors and peripheral circuits are formed. For the semiconductor substrate 21, for example, a Si substrate may be used. In proximity to the surface (the surface S2) of the Si substrate, the transistors such as the transfer transistor and the peripheral circuits such as a logic circuit are formed. Next, an impurity semiconductor region is formed by ion implantation to the semiconductor substrate 21. Specifically, an n-type semiconductor region (the photoelectric conversion section 22) is formed at a position corresponding to each of the pixels P, and a p-type semiconductor region is formed between the pixels P. Subsequently, the pixel separation groove 21A may be formed at a predetermined position of the light-receiving surface S1 of the semiconductor substrate 21, specifically, in the p-type semiconductor region provided between the pixels P. The pixel separation groove 21A may be formed by, for example, dry etching, to have a depth (h) of 1 nm, for example.

Next, the fixed charge film 23 is formed on the light-receiving surface S1 side of the semiconductor substrate 21. Specifically, at first, as illustrated in FIG. 2A, the first insulating film $23A_1$ may be formed by, for example, ALD or MOCVD. The first insulating film $23A_1$ is contiguously provided on the light-receiving surface S1 of the semiconductor substrate 21 as well as from a wall surface to a bottom surface of the pixel separation groove 21A. When ALD is used, the first insulating film $23A_1$ may be formed based on, for example, such conditions that a substrate temperature is 200° C. to 500° C., a flow quantity of a precursor is 10 sccm to 500 sccm, an irradiation time of the precursor is 1 second to 15 seconds, and a flow quantity of ozone ($O_3$) is 5 sccm to 50 sccm. When MOCVD is used, the first insulating film $23A_1$ may be formed, for example, using a substrate temperature of 100° C. to 600° C. It is to be noted that, when the Si substrate is used as the semiconductor substrate 21 and the first insulating film $23A_1$ is formed on the Si substrate by using ALD, a silicon oxide film reducing an interface state and having a thickness of about 1 nm is allowed to be concurrently formed on the surface of the Si substrate.

Next, as illustrated in FIG. 2B, the second insulating film 23B may be formed on the first insulating film $23A_1$, by using, for example, PVD. Conditions for this formation may be, for example, a pressure of 0.01 Pa to 50 Pa, power of 500 W to 2,000 W, an Ar flow quantity of 5 sccm to 50 sccm, and an oxygen ($O_2$) flow quantity of 5 sccm to 50 sccm. It is to be noted that, by a shadowing effect, the second insulating film 23B formed by PVD is formed only on the light-receiving surface S1 of the semiconductor substrate 21 and on a part of the wall surface, which is contiguous to the light-receiving surface S1, of the pixel separation groove 21A. The second insulating film 23B is not formed in inside (most part of the wall surface and the bottom surface) of the pixel separation groove 21A.

Next, as illustrated in FIG. 2C, the first insulating film $23A_2$ may be formed on the second insulating film 23B and the first insulating film $23A_1$ by using, for example, ALD or MOCVD. The first insulating film $23A_1$ covers the wall surface and the bottom surface of the pixel separation groove 21A. Conditions in ALD and MOCVD are similar to those described above. The fixed charge film 23 is thus formed.

As described above, after the first insulating film $23A_1$ is formed on the entire back surface of the semiconductor substrate 21 by ALD or MOCVD, the second insulating film 23B is formed on the light-receiving surface S1 side of the first insulating film $23A_1$ by PVD. The fixed charge film ($23A_1$, 23B, and $23A_2$) having an antireflection function is allowed to be formed on the surface part of the semiconductor substrate 21 without degrading interfacial quality, and at the same time, the fixed charge film ($23A_1$ and $23A_2$) improving the interface state is allowed to be formed in the groove.

It is to be noted that, as described above, the fixed charge film 23 may be formed in film formation order other than the lamination order illustrated in FIGS. 2A to 2C. Specifically, for example, the fixed charge film 23 may be formed as illustrated in FIGS. 3A to 3C. First, the first insulating film $23A_1$ is formed in a region from the light-receiving surface S1 of the semiconductor substrate 21 to the wall surface and the bottom surface of the pixel separation groove 21A by using ALD or MOCVD in a manner similar to that in the above-described manufacturing process. Subsequently, the first insulating film $23A_2$ is formed using ALD or MOCVD again. The second insulating film 23B is then formed by PVD. In this way, if at least the insulating film is directly formed on the back surface of the semiconductor substrate 21 by ALD or MOCVD that is less likely to damage a film-formed surface, any manufacturing method may be adopted for an insulating film to be subsequently laminated.

Next, as the protective film 24, for example, a $SiO_2$ film may be formed on the fixed charge film 23 on the light-receiving surface S1 by using, for example, ALD or chemical vapor deposition (CVD). The pixel separation groove 21A is filled with the $SiO_2$ film. Subsequently, for example, a W film may be formed on the protective film 24 by using, for example, sputtering or CVD, and then patterned by photolithography so that the light-shielding film 42 is formed. Next, the flattening film 43 is formed on the protective film 24 and the light-shielding film 42. Subsequently, for example, the color filter 44 in the Bayer array and the on-chip lens 41 may be formed in this order on the flattening film 43. The image pickup element 10 may be thus obtained.

(Operation of Image Pickup Element)

In the image pickup element 10 as described above, signal charge (here, an electron) may be obtained in the pixel P of the image pickup device as follows, for example. Upon entering the image pickup element 10 through the on-chip lens 41, light L passes through the color filter 44 and the like and then is detected (absorbed) by the photoelectric conversion section 22 in each of the pixels P, so that red, green, or blue color light is photoelectrically converted. Of an electron-hole pair generated in the photoelectric conversion section 22, the electron moves to the semiconductor substrate 21 (for example, the n-type semiconductor region in the Si substrate) to be stored, while the positive hole moves to the p-type region to be discharged.

(Functions and Effects)

As described earlier, in an image pickup element having a photoelectric conversion section configured of, for example, a semiconductor material such as Si, a dark current may be easily generated due to crystal defects and dangling bonds present on a surface of the photoelectric conversion section. The dark current may be suppressed by forming an insulating film (a fixed charge film) having fixed charge, on a surface of a semiconductor substrate.

Further, in an image pickup element, optical color mixture may be suppressed by providing a groove between pixels of a semiconductor substrate and filling this groove with an insulating film. However, in general, this groove is formed by dry etching and therefore, crystal defects as well as an interface state are easily formed on a surface of the semiconductor substrate due to damage caused by the dry etching. Therefore, although the optical color mixture may be suppressed, the dark current may be easily generated.

The dark current generated in the groove may be suppressed by forming the above-described fixed charge film on a wall surface and a bottom surface of the groove. Further, an insulating film producing both a dark-current suppression effect and an antireflection effect may be achieved using, for example, an insulating material having a refractive index of 2 or more as a material of the fixed charge film, and forming a film of this material over the entire back surface including the groove. However, there has been the following issue for the fixed charge film. In general, PVD whose deposition rate is high is selected in view of producibility. However, PVD damages a film formation region, namely, here, the entire back surface of the semiconductor substrate including the groove, thereby degrading interfacial quality. In particular, a dark current is more easily generated at the surface (the wall surface and the bottom surface) of the groove, the surface being damaged by the dry etching used in forming the groove.

In contrast, in the image pickup element 10 and the method of manufacturing the same according to the present embodiment, the fixed charge film 23 is a laminated film (including the first insulating film 23A and the second insulating film 23B), and the layers thereof are formed using different methods. Specifically, at first, the first insulating film $23A_1$ is formed using ALD or MOCVD on the semiconductor substrate 21 and then, the second insulating film 23B is formed using PVD. Subsequently, the first insulating film $23A_2$ is formed using ALD or MOCVD. When the formation of the film (the first insulating film $23A_1$) by ALD or MOCVD is performed before the film formation by PVD as described above, it is possible to prevent damage to the film formation surface by PVD. This is due to properties of the first insulating film $23A_1$ formed by ALD or MOCVD.

When film formation is performed using ALD or MOCVD, a more minute film with a high degree of crystallization is formed. For this reason, the first insulating film $23A_1$ acts as a protective film of the semiconductor substrate 21, which reduces damage to the surface of the semiconductor substrate 21 in forming the second insulating film 23B by PVD. Therefore, it is possible to improve the interfacial quality of the light-receiving surface S1. In addition, it is possible to suppress deterioration in unpinning that occurs due to physical damage to the wall surface and the bottom surface of the pixel separation groove 21A in forming the pixel separation groove 21A or impurity inactivation by ion irradiation. It is to be noted that a lower limit, which is necessary for reduction of damage to the surface of the semiconductor substrate 21 by PVD, of the film thickness of the first insulating film $23A_1$ may be preferably 1 nm or more, and a upper limit may be preferably 25 nm or less in view of a film formation time.

In addition, the first insulating films $23A_1$ and $23A_2$ are formed, using ALD or MOCVD, on the entire surface (the light-receiving surface S1 as well as the wall surface and the bottom surface of the pixel separation groove 21A) on the light incident surface side of the semiconductor substrate 21. Moreover, the second insulating film 23B is formed, using PVD, on the light-receiving surface S1 and the part of the wall surface, which is contiguous to the light-receiving surface S1, of the pixel separation groove 21A by the shadowing effect to be described below. The shadowing effect in the second insulating film 23B depends on the depth (h) of the pixel separation groove 21A. The deeper the depth (h) is, the greater the shadowing effect is, so that film formation on the wall surface of the pixel separation groove 21A is suppressed. The depth (h) allowing suppression of the film formation on the wall surface may be preferably 1 μm or more. When the depth (h) is less than 1 μm, a groove shape may be desirably an overhang type.

As described above, in the present embodiment, the fixed charge film 23, which is formed on the light-receiving surface side of the semiconductor substrate 21 including the photoelectric conversion section 22, is formed as a laminated film including two kinds of different insulating films (the first insulating film 23A and the second insulating film 23B) formed in different regions. Specifically, the first insulating film 23A is formed on the entire surface (the light-receiving surface S1 as well as the wall surface and the bottom surface of the pixel separation groove 21A) on the light incident surface side of the semiconductor substrate 21 by using ALD or MOCVD. Further, the second insulating film 23B is formed on the light-receiving surface S1 by using PVD. In particular, the second insulating film 23B is formed after the first insulating film 23A is formed and therefore, it is possible to form a fixed charge film without damaging the surface of the semiconductor substrate 21. In other words, it is possible to provide an image pickup device in which the interface state of the surface (the light-receiving surface S1 as well as the wall surface and the bottom surface of the pixel separation groove 21A) of the semiconductor substrate 21 is improved and generation of a dark current is suppressed.

Further, the lamination order of the first insulating film $23A_2$ and the second insulating film 23B after the first insulating film $23A_1$ is formed on the semiconductor substrate 21 is not limited in particular. However, it is possible to prevent entrance of impurities such as oxygen and hydrogen into the semiconductor substrate 21, by forming the first insulating film $23A_2$ after the second insulating film 23B is formed as illustrated in FIGS. 2A to 2C. This makes it possible to further improve the interface state and pinning performance on the light-receiving surface S1.

Furthermore, as compared with ALD and MOCVD, PVD provides a high deposition rate and therefore, it is possible to form a film that is thick to some extent in a relatively short time by PVD. Therefore, by forming the second insulating film 23B using a material having a relatively high refractive index, antireflection performance of the fixed charge film 23 for obliquely entering light is improved, which allows suppression of color mixture in the photoelectric conversion section 22.

It is to be noted that, in the present embodiment, the fixed charge film 23 is configured such that the first insulating film 23A includes two layers and the second insulating film 23B includes one layer, but these films may each include two layers, or three more layers.

2. Modification

Figure 4:
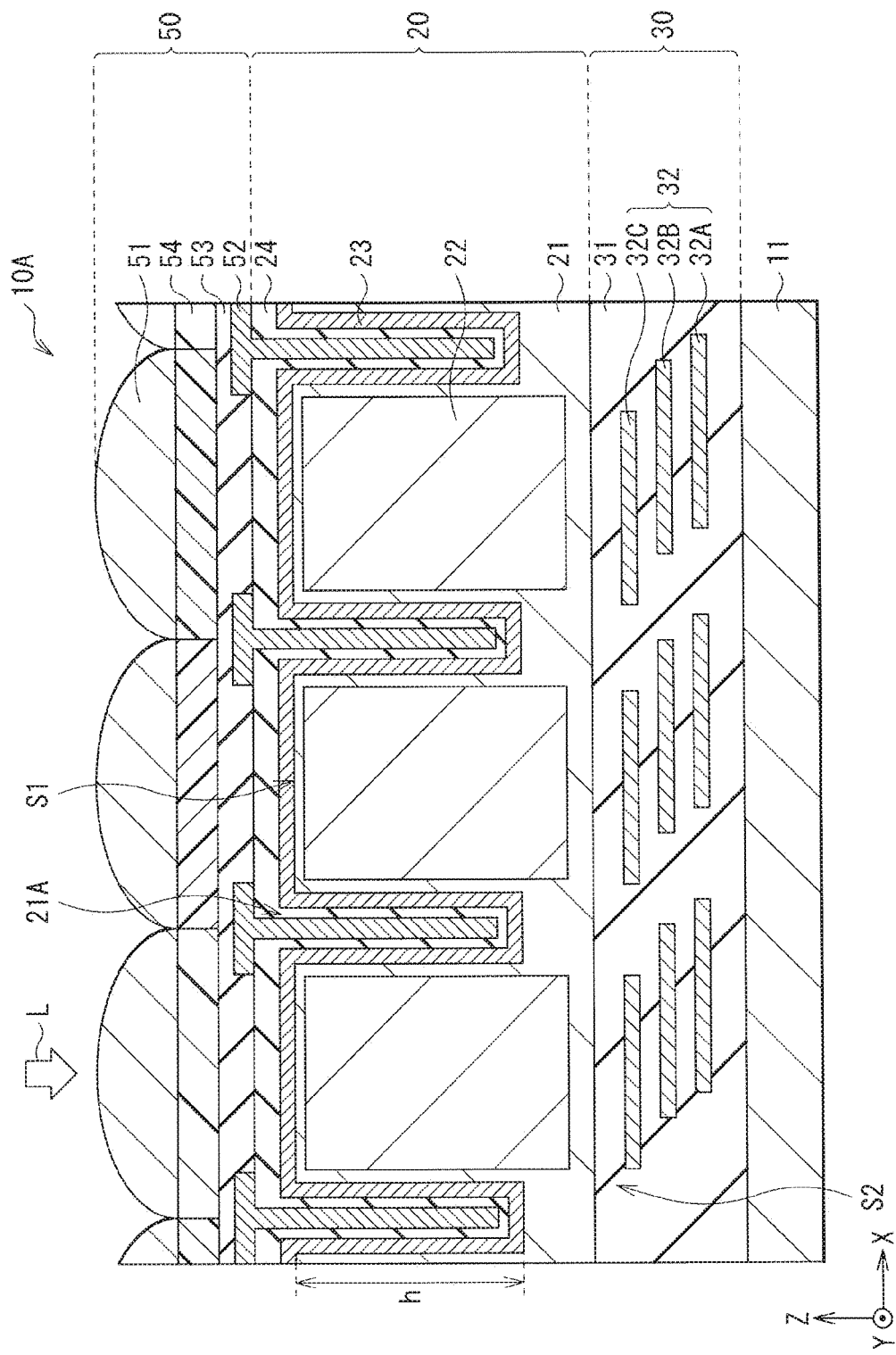
FIG. 4 is a cross-sectional diagram of an image pickup element according to a modification of the present disclosure.

FIG. 4 illustrates a cross-sectional configuration of an image pickup element (an image pickup element 10A) according to a modification of the above-described embodiment. The image pickup element 10A is of the backside illumination type and has a structure having the plurality of pixels P two-dimensionally arranged, in a manner similar to that of the above-described embodiment. In the light receiving section 20 of the image pickup element 10A, the pixel separation groove 21A is provided between the pixels P of the semiconductor substrate 21 in a manner similar to that of the above-described embodiment. The fixed charge film 23 is formed on the light-receiving surface S1 of the semiconductor substrate 21 as well as the wall surface and the bottom surface of the pixel separation groove 21A, and the protective film 24 is formed on the fixed charge film 23. In a condensing section 50, in a manner similar to that in the above-described embodiment, a flattening film 53, a light-shielding film 52, and a color filter 54 are laminated between the light receiving section 20 and an on-chip lens 51. In the image pickup element 10A of the present modification, the light-shielding film 52 is extended inside the pixel separation groove 21A, which is different from the above-described embodiment. Except this point, the image pickup element 10A has a configuration similar to that of the image pickup element 10, and has similar functions and effects as well.

In this way, in the present modification, the light-shielding film 52 is embedded in the pixel separation groove 21A of the light receiving section 20. Therefore, it is possible to further suppress color mixture due to obliquely entering light in the photoelectric conversion section 22.

3. Application Examples

Figure 5:
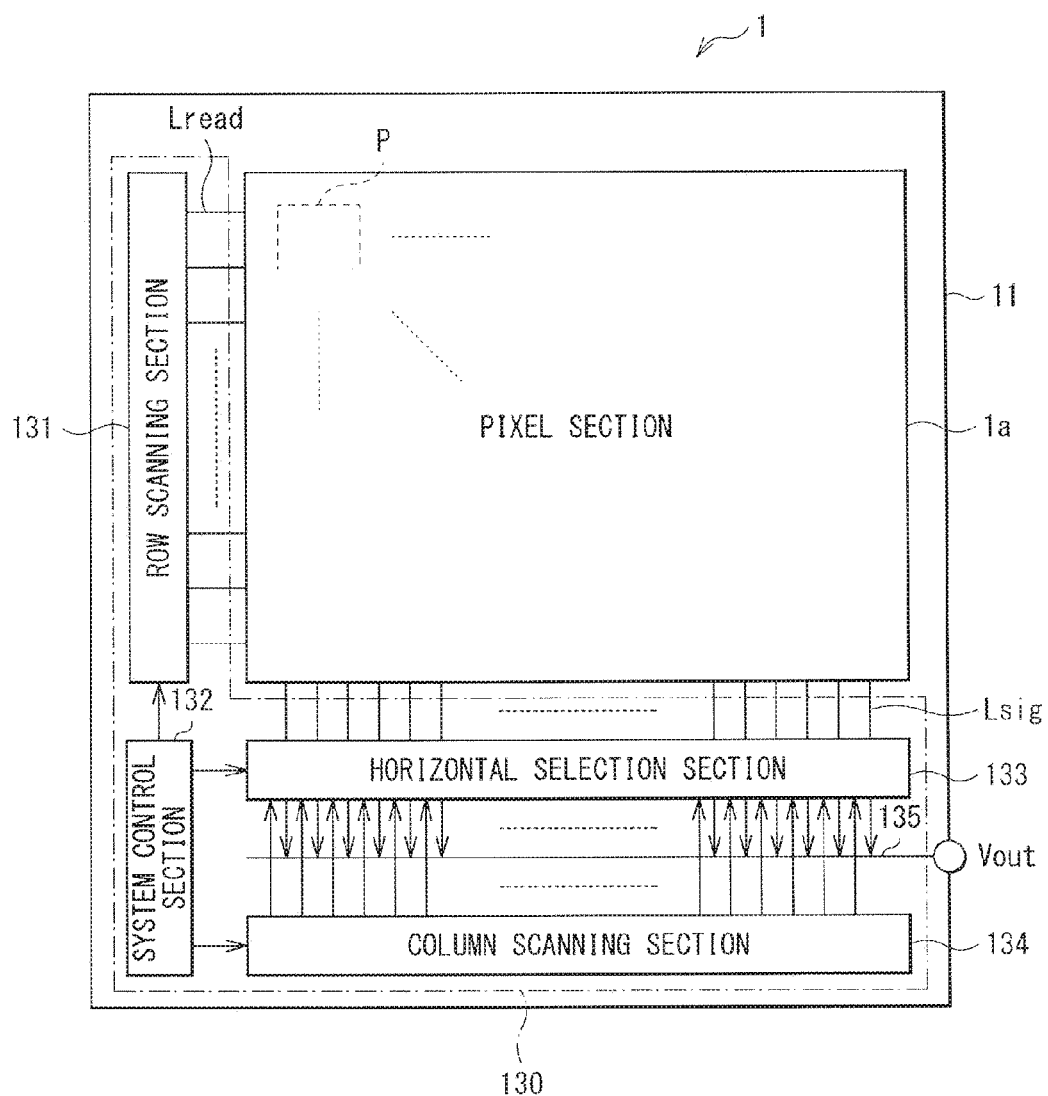
FIG. 5 is a functional block diagram of a solid-state image pickup device according to an application example.

FIG. 5 illustrates an overall configuration of a solid-state image pickup device (the image pickup device 1) in which any of the image pickup elements (the image pickup elements 10 and 10A) of the above-described embodiment and modification is used for each pixel. The image pickup device 1 may be a CMOS image sensor, and includes a pixel section 1a serving as an image pickup area, in a central part on the semiconductor substrate 21. In a peripheral region of the pixel section 1a, for example, a peripheral circuit section 130 including a row scanning section 131, a system control section 132, a horizontal selection section 133, and a column scanning section 134 may be provided.

The pixel section 1a may include, for example, a plurality of unit pixels P (each equivalent to the image pickup element 10 or 10A) two-dimensionally arranged in rows and columns. To the unit pixel P, for example, a pixel driving line Lread (specifically, a row selecting line and a reset control line) may be wired for each pixel row, and the vertical signal line Lsig may be wired for each pixel column. The pixel driving line Lread transmits a drive signal for signal reading from a pixel, and has one end connected to an output terminal of the row scanning section 131, the output terminal corresponding to each row.

The row scanning section 131 includes components such as a shift register and an address decoder. The row scanning section 131 may be, for example, a pixel driving section that drives the pixels P of the pixel section 1a row by row. A signal outputted from each of the pixels P in the pixel row selected by the row scanning section 131 is supplied to the horizontal selection section 133 through each of the vertical signal lines Lsig. The horizontal selection section 133 may be configured of, for example, components such as an amplifier and a horizontal selection switch provided for each of the vertical signal lines Lsig.

The column scanning section 134 includes components such as a shift register and an address decoder, and drives the horizontal selection switches of the respective horizontal selection sections 133 while sequentially scanning these horizontal selection switches. By this selective scanning of the column scanning section 134, a signal of each of the pixels P transmitted through each of the vertical signal lines Lsig is sequentially outputted to a horizontal signal line 135, and then transmitted to the outside of the semiconductor substrate 21 through the horizontal signal line 135.

A circuit portion including the row scanning section 131, the horizontal selection section 133, the column scanning section 134, and the horizontal signal line 135 may be directly formed on the semiconductor substrate 21, or may be disposed in an external control IC. It is possible to provide this circuit portion in other substrate connected by a cable or the like.

The system control section 132 receives a clock provided from outside the semiconductor substrate 21 as well as data commanding an operation mode, and outputs inside information of the image pickup device 1. In addition, the system control section 132 may include, for example, a timing generator that generates various timing signals. The system control section 132 may control driving of the peripheral circuits such as the row scanning section 131, the horizontal selection section 133, and the column scanning section 134, based on the various timing signals generated by the timing generator.

Figure 6:
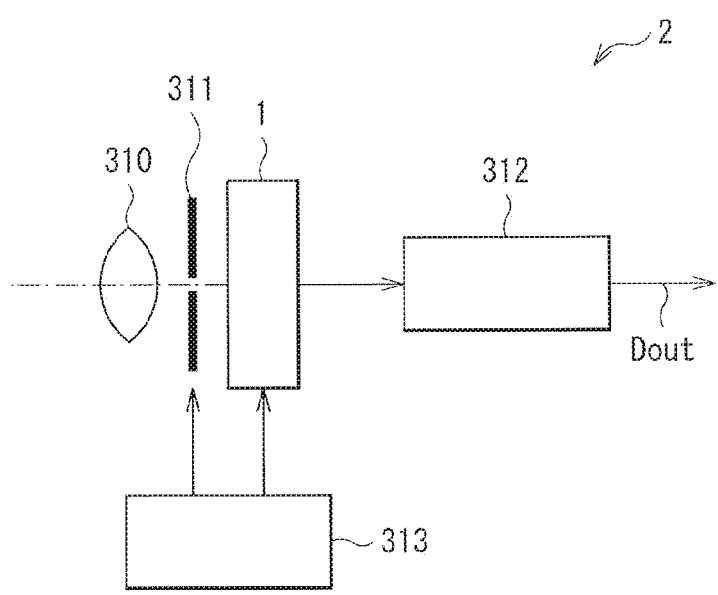
FIG. 6 is a functional block diagram of an electronic apparatus according to another application example.

The image pickup device 1 as described above is applicable to all types of electronic apparatuses having an image pickup function. Examples of the electronic apparatuses may include camera systems such as digital still cameras and video cameras, as well as mobile phones. As an example, FIG. 6 illustrates a schematic configuration of a camera (an electronic apparatus 2). The electronic apparatus 2 may be, for example, a video camera capable of shooting a still image or a moving image. The electronic apparatus 2 may include an image pickup device (the image pickup device 1), an optical system (an optical lens) 310, a shutter unit 311, a signal processing section 312, and a drive section 313.

The optical system 310 guides image light (incident light) from a subject to the pixel section 1a of the image pickup device 1. The optical system 310 may include a plurality of optical lenses. The shutter unit 311 controls an optical irradiation period and a shielding period for the image pickup device 1. The drive section 313 controls shutter operation of the shutter unit 311 and transfer operation of the image pickup device 1. The signal processing section 312 performs various kinds of signal processing on a signal outputted from the image pickup device 1. For example, an image signal Dout after the signal processing may be stored in a storage medium such as a memory, or outputted to a unit such as a monitor.

Further, in the above-described embodiment and the like, the configurations of the image pickup element 10 and 10A of the backside illumination type have been each taken as an example. However, the present technology is applicable to a front illumination type.

Furthermore, an inner lens (not illustrated) may be disposed between the light receiving section 20 and the color filter 44 (or 54) of the condensing section 40 (or 50).

Still furthermore, it is not necessary to provide all the components of the above-described embodiment and the like, and other component may be provided.

It is possible to achieve at least the following configurations from the above-described example embodiments of the disclosure.

(1) An image pickup element including:
   a semiconductor substrate including a photoelectric conversion section for each pixel;
   a pixel separation groove provided in the semiconductor substrate; and
   a fixed charge film provided on a light-receiving surface side of the semiconductor substrate,
   wherein the fixed charge film includes a first insulating film and a second insulating film, the first insulating film being provided contiguously from the light-receiving surface to a wall surface and a bottom surface of the pixel separation groove, and the second insulating film being provided on a part of the first insulating film, the part corresponding to at least a portion of the light-receiving surface.
(2) The image pickup element according to (1), wherein the first insulating film and the second insulating film are different in number of layers.
(3) The image pickup element according to (1), wherein, in the fixed charge film, the first insulating film, the second insulating film, and the first insulating film are formed in order from the semiconductor substrate side.
(4) The image pickup element according to (1), wherein, in the fixed charge film, the first insulating film, the first insulating film, and the second insulating film are formed in order from the semiconductor substrate side.
(5) The image pickup element according to (1), wherein the second insulating film is contiguous from the light-receiving surface to a part of the wall surface of the pixel separation groove.
(6) The image pickup element according to (1), wherein the first insulating film and the second insulating film are each formed of any one of hafnium oxide ($HfO_2$), zirconium oxide ($ZrO_2$), aluminum oxide ($Al_2O_3$), titanium oxide ($TiO_2$), and tantalum oxide ($Ta_2O_5$).
(7) The image pickup element according to (1), wherein the first insulating and the second insulating film are made of a same material.
(8) The image pickup element according to (7), wherein the material is any one of hafnium oxide ($HfO_2$), zirconium oxide ($ZrO_2$), aluminum oxide ($Al_2O_3$), titanium oxide ($TiO_2$), and tantalum oxide ($Ta_2O_5$).
(9) The image pickup element according to (8), wherein the material includes silicon.
(10) The image pickup element according to (1), further comprising a protective film in the pixel separation groove.
(11) The image pickup element according to (10), wherein the protective film is any one of silicon nitride ($Si_2N_3$), silicon oxide ($SiO_2$) and silicon oxynitride (SiON).
(12) A method of manufacturing an image pickup element, the method including forming a fixed charge film on a light-receiving surface of a semiconductor substrate that includes a photoelectric conversion section for each pixel and has a pixel separation groove,
   wherein the forming of the fixed charge film includes
   forming a first insulating film to be provided contiguously from the light-receiving surface to a wall surface and a bottom surface of the pixel separation groove, and
   forming a second insulating film to be provided on a part of the first insulating film, the part corresponding to at least the light-receiving surface.
(13) The method according to (12), wherein the first insulating film is formed by atomic layer deposition or metal organic chemical vapor deposition.
(14) The method according to (12), wherein the second insulating film is formed by physical vapor deposition.
(15) An electronic apparatus provided with an image pickup element, the image pickup element including:
   a semiconductor substrate including a photoelectric conversion section for each pixel;
   a pixel separation groove provided in the semiconductor substrate; and
   a fixed charge film provided on a light-receiving surface side of the semiconductor substrate,
   wherein the fixed charge film includes a first insulating film and a second insulating film, the first insulating film being provided contiguously from the light-receiving surface to a wall surface and a bottom surface of the pixel separation groove, and the second insulating film being provided on a part of the first insulating film, the part corresponding to at least the light-receiving surface.

It should be understood by those skilled in the art that various modifications, combinations, sub-combinations, and alterations may occur depending on design requirements and other factors insofar as they are within the scope of the appended claims or the equivalents thereof.

What is claimed is:
1. An electronic apparatus comprising:
   an imaging device including:
   a semiconductor substrate having a first side and a second side;
   a photoelectric conversion section disposed in the semiconductor substrate;
   a pixel separation groove disposed in the semiconductor substrate and adjacent to the photoelectric conversion section;
   a plurality of insulating films disposed adjacent to the first side of the semiconductor substrate; and
   a silicon oxide film,
   wherein each insulating film of the plurality of insulating films includes at least one member selected from the group consisting of: hafnium oxide, zirconium oxide, aluminum oxide, titanium oxide, and tantalum oxide,
      the silicon oxide film contacts a surface of a first insulating film of the plurality of insulating films and a surface of a second insulating film of the plurality of insulating films,
      the first insulating film of the plurality of insulating films is disposed inside of the pixel separation groove,
      a thickness of at least a portion of the second insulating film of the plurality of insulating films is greater than or equal to 10 nm and less than or equal to 80 nm, and the first insulating film of the plurality of insulating films and the second insulating film of the plurality of insulating films are made of a same material;
a signal processing section configured to process a signal received from the imaging device; and
an optical system including at least one optical lens, wherein the optical system is configured to guide light to the imaging device.

2. The electronic apparatus according to claim 1, wherein the first insulating film of the plurality of insulating films has a number of layers that is different from the second insulating film of the plurality of insulating films.

3. The electronic apparatus according to claim 1, wherein the first insulating film of the plurality of insulating films and the second insulating film of the plurality of insulating films are formed in a lamination order from the first side of the semiconductor substrate.

4. The electronic apparatus according to claim 1, wherein the second insulating film of the plurality of insulating films is contiguous from a light-receiving surface side of the semiconductor substrate to a part of a wall surface of the pixel separation groove.

5. The electronic apparatus according to claim 1, further comprising:
at least one other film disposed in the pixel separation groove, wherein the at least one other film is a protective film.

6. The electronic apparatus according to claim 5, wherein the first insulating film of the plurality of insulating films includes portions disposed between the semiconductor substrate and the at least one other film.

7. The electronic apparatus according to claim 6, wherein the first insulating film of the plurality of insulating films includes portions disposed between the semiconductor substrate and the second insulating film of the plurality of insulating films.

8. The electronic apparatus according to claim 1, wherein a thickness of the first insulating film of the plurality of insulating films is greater than or equal to 2 nm and less than or equal to 100 nm.

9. The electronic apparatus according to claim 1, wherein the first insulating film of the plurality of insulating films includes portions disposed between the semiconductor substrate and the second insulating film of the plurality of insulating films.

10. The electronic apparatus according to claim 1, wherein the first insulating film of the plurality of insulating films and the second insulating film of the plurality of insulating films include silicon.

11. The electronic apparatus according to claim 1, wherein a width of the pixel separation groove is greater than or equal to 100 nm and less than or equal to 1000 nm.

12. The electronic apparatus according to claim 1, wherein a depth of the pixel separation groove is greater than or equal to 0.25 μm and less than or equal to 5 μm.

13. The electronic apparatus according to claim 1, wherein the first insulating film of the plurality of insulating films and the second insulating film of the plurality of insulating films are partially laminated.

14. The electronic apparatus according to claim 13, wherein the first insulating film of the plurality of insulating film includes a plurality of layers.

15. The electronic apparatus according to claim 14, wherein at least a portion of the second insulating film of the plurality of insulating films is provided within the pixel separation groove.

16. The electronic apparatus according to claim 1, wherein at least a portion of the second insulating film of the plurality of insulating films is provided within the pixel separation groove.

17. The electronic apparatus according to claim 15, wherein the at least a portion of the second insulating film of the plurality of insulating films provided within the pixel separation groove is disposed between two layers of the first insulating film of the plurality of insulating films.

18. An electronic apparatus comprising:
an imaging device including:
a semiconductor substrate having a first side and a second side, the semiconductor substrate including:
a photoelectric conversion section, and
a pixel separation groove adjacent to the photoelectric conversion section,
a first film disposed adjacent to the first side of the semiconductor substrate and inside of the pixel separation groove,
a second film disposed on the first film and inside of the pixel separation groove, and
a third film disposed on the second film and inside of the pixel separation groove,
wherein, the first film and the third film are made of a same material,
the first film and the third film include at least one member selected from the group consisting of:
hafnium oxide, zirconium oxide, aluminum oxide, titanium oxide, and tantalum oxide, and
a thickness of at least one of the first film and the third film is greater than or equal to 10 nm and less than or equal to 80 nm;
a signal processing section configured to process a signal received from the imaging device; and
an optical system including at least one optical lens, wherein the optical system is configured to guide light to the imaging device.

19. The electronic apparatus according to claim 18, wherein the material of the first film and the third film are different from a material of the second film.

20. The electronic apparatus according to claim 18, wherein a silicon oxide film contacts a surface of the third film.

21. The electronic apparatus according to claim 18, wherein the silicon oxide film is formed above the photoelectric conversion section.

22. The electronic apparatus according to claim 18, wherein the third film is contiguous from a light-receiving surface side of the semiconductor substrate to a part of a wall surface of the pixel separation groove.

23. The electronic apparatus according to claim 18, wherein the first film includes portions disposed between the semiconductor substrate and the second film.

24. The electronic apparatus according to claim 23, wherein the first film includes portions disposed between the semiconductor substrate and the third film.

25. The electronic apparatus according to claim 18, wherein the first film includes portions disposed between the semiconductor substrate and the third film.

26. The electronic apparatus according to claim 18, wherein a width of the pixel separation groove is greater than or equal to 100 nm and less than or equal to 1000 nm.

27. The electronic apparatus according to claim 18, wherein a depth of the pixel separation groove is greater than or equal to 0.25 μm and less than or equal to 5 μm.

28. The electronic apparatus according to claim 18, wherein one or more of the first film, the second film, or the third film include silicon.

* * * * *